(12) United States Patent
Takezono

(10) Patent No.: US 11,943,867 B2
(45) Date of Patent: Mar. 26, 2024

(54) ELECTRONIC COMPONENT

(71) Applicant: Murata Manufacturing Co., Ltd., Kyoto (JP)

(72) Inventor: Naofumi Takezono, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/465,130

(22) Filed: Sep. 2, 2021

(65) Prior Publication Data

US 2022/0071007 A1    Mar. 3, 2022

(30) Foreign Application Priority Data

Sep. 3, 2020 (JP) .................................. 2020-148509

(51) Int. Cl.
*H05K 1/11* (2006.01)
*H05K 1/18* (2006.01)

(52) U.S. Cl.
CPC .............. *H05K 1/111* (2013.01); *H05K 1/18* (2013.01); *H05K 1/181* (2013.01); *H05K 2201/09036* (2013.01)

(58) Field of Classification Search
CPC .................. H05K 1/111; H05K 1/181; H05K 2201/09036; H05K 2201/09827; Y02P 70/50; H01R 4/029
See application file for complete search history.

(56) References Cited

U.S. PATENT DOCUMENTS

| | | | | |
|---|---|---|---|---|
| 6,606,237 B1 * | 8/2003 | Naito | ..................... | H01G 4/232 361/306.3 |
| 8,508,912 B2 * | 8/2013 | Yamamoto | ............... | H01G 4/35 361/312 |
| 9,538,636 B1 * | 1/2017 | Weigand | ................. | H01L 23/14 |
| 2002/0005567 A1 * | 1/2002 | Sakai | ................ | H01L 23/49805 257/618 |
| 2009/0052110 A1 * | 2/2009 | Masuda | ................. | H01G 4/005 361/303 |
| 2015/0282326 A1 * | 10/2015 | Hattori | ................... | H05K 1/141 174/260 |

FOREIGN PATENT DOCUMENTS

| | | |
|---|---|---|
| JP | H02-278751 A | 11/1990 |
| JP | 2002-208765 A | 7/2002 |
| JP | 2009-049046 A | 3/2009 |

* cited by examiner

*Primary Examiner* — Ishwarbhai B Patel
(74) *Attorney, Agent, or Firm* — Pearne & Gordon LLP

(57) ABSTRACT

An electronic component includes a main body portion that has a first main surface having first and second sides, a second main surface opposite to the first main surface, a first side surface sharing the first side with the first main surface, and a second side surface sharing the second side with the first main surface, connection terminals that have electrical conductivity and that are arranged on the first main surface so as to be isolated from each other, and side-surface terminals that have electrical conductivity. The main body portion has side-surface grooves that are formed in the first and second side surfaces and that extend from the first main surface toward the second main surface. The side-surface terminals are provided on inner sides of the side-surface grooves and are each electrically connected to at least one of two end portions of the corresponding connection terminal.

11 Claims, 8 Drawing Sheets

ELECTRONIC COMPONENT

CROSS REFERENCE TO RELATED APPLICATION

This application claims priority from Japanese Patent Application No. 2020-148509 filed on Sep. 3, 2020. The content of this application is incorporated herein by reference in its entirety.

BACKGROUND OF THE DISCLOSURE

Field of the Disclosure

The present disclosure relates to an electronic component.

Description of the Related Art

As described in Japanese Unexamined Patent Application Publication No. 2009-49046, an electronic component that is produced separately from a substrate includes connection terminals provided on a surface thereof that faces the substrate. The connection terminals of the electronic component and metal pads of the substrate are joined to each other with solder, so that the electronic component is mounted on the substrate.

BRIEF SUMMARY OF THE DISCLOSURE

If the amount of a joining member that is interposed between an electronic component and a substrate is large, the height of the electronic component increases, which is not desirable.

The present disclosure has been made in view of the above, and it is an object of the present disclosure to provide an electronic component capable of achieving a reduction in the height thereof.

An electronic component according to preferred embodiments of the present disclosure includes a main body portion that has a first main surface having a first side and a second side, which is opposite to the first side, a second main surface opposite to the first main surface, a first side surface sharing the first side with the first main surface, and a second side surface sharing the second side with the first main surface, a plurality of connection terminals that have electrical conductivity and that are arranged on the first main surface in such a manner as to be isolated from each other, and side-surface terminals that have electrical conductivity. The main body portion has side-surface grooves that are formed in the first side surface and the second side surface and that extend from the first main surface toward the second main surface. The side-surface terminals are provided on inner sides of the side-surface grooves of the main body portion and are each electrically connected to at least one of two end portions of one of the connection terminals.

At the time of joining, joining members that are interposed between metal pads of a substrate and the connection terminals flow into the side-surface grooves via the side-surface terminals due to the capillary action thereof. As a result, the amount of the joining members interposed between the metal pads of the substrate and the connection terminals is reduced, and the height of the electronic component is reduced.

According to the electronic component of the present disclosure, a reduction in the height of the electronic component can be achieved. Other features, elements, characteristics and advantages of the present disclosure will become more apparent from the following detailed description of preferred embodiments of the present disclosure with reference to the attached drawings.

DETAILED DESCRIPTION OF THE DISCLOSURE

Embodiments of the disclosure will be described in detail with reference to the drawings. The present disclosure is not limited to the contents of the following descriptions. In addition, components that will be described below include those that can be easily conceived by those skilled in the art and those that are substantially the same. Furthermore, the components that will be described below can be suitably combined.

First Embodiment

Figure 1:
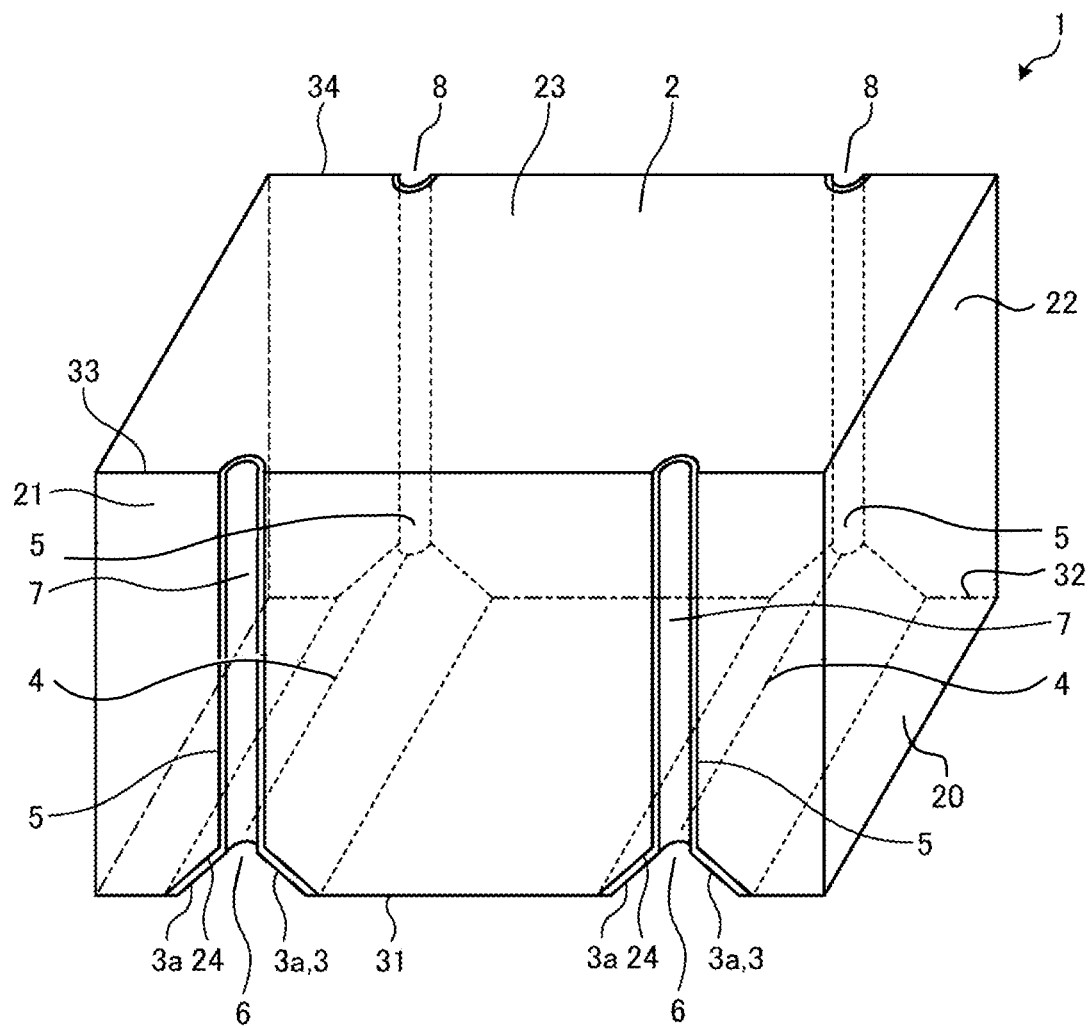
FIG. 1 is a perspective view of an electronic component according to a first embodiment.
Figure 2:
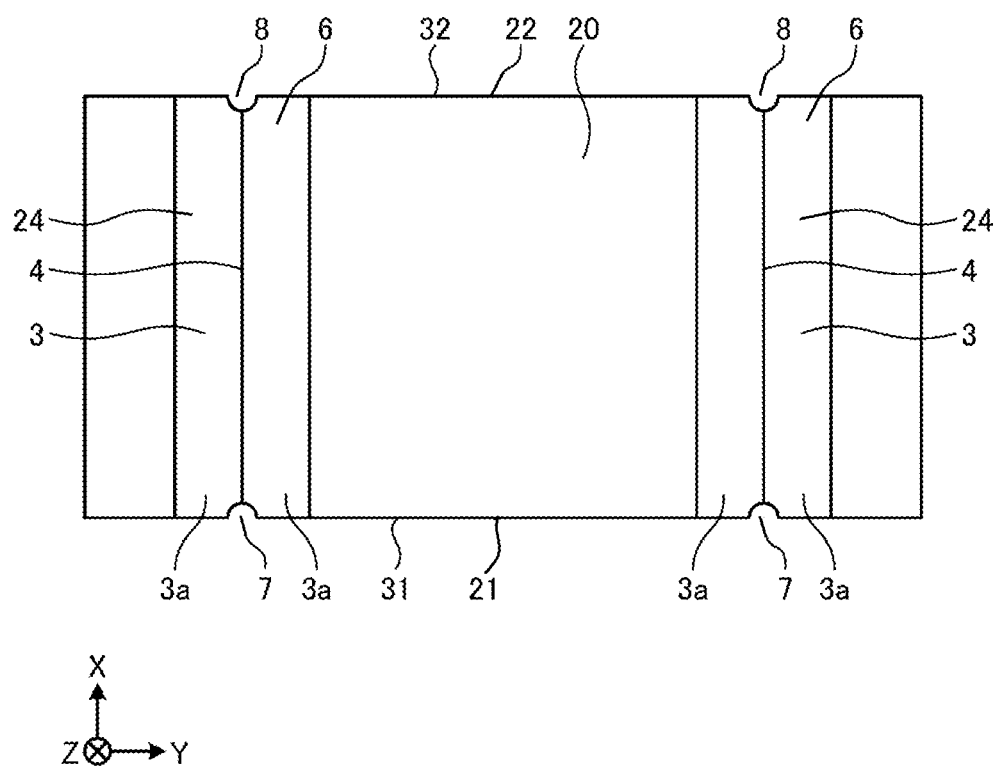
FIG. 2 is a bottom view of the electronic component according to the first embodiment when viewed from a first main surface.
Figure 3:
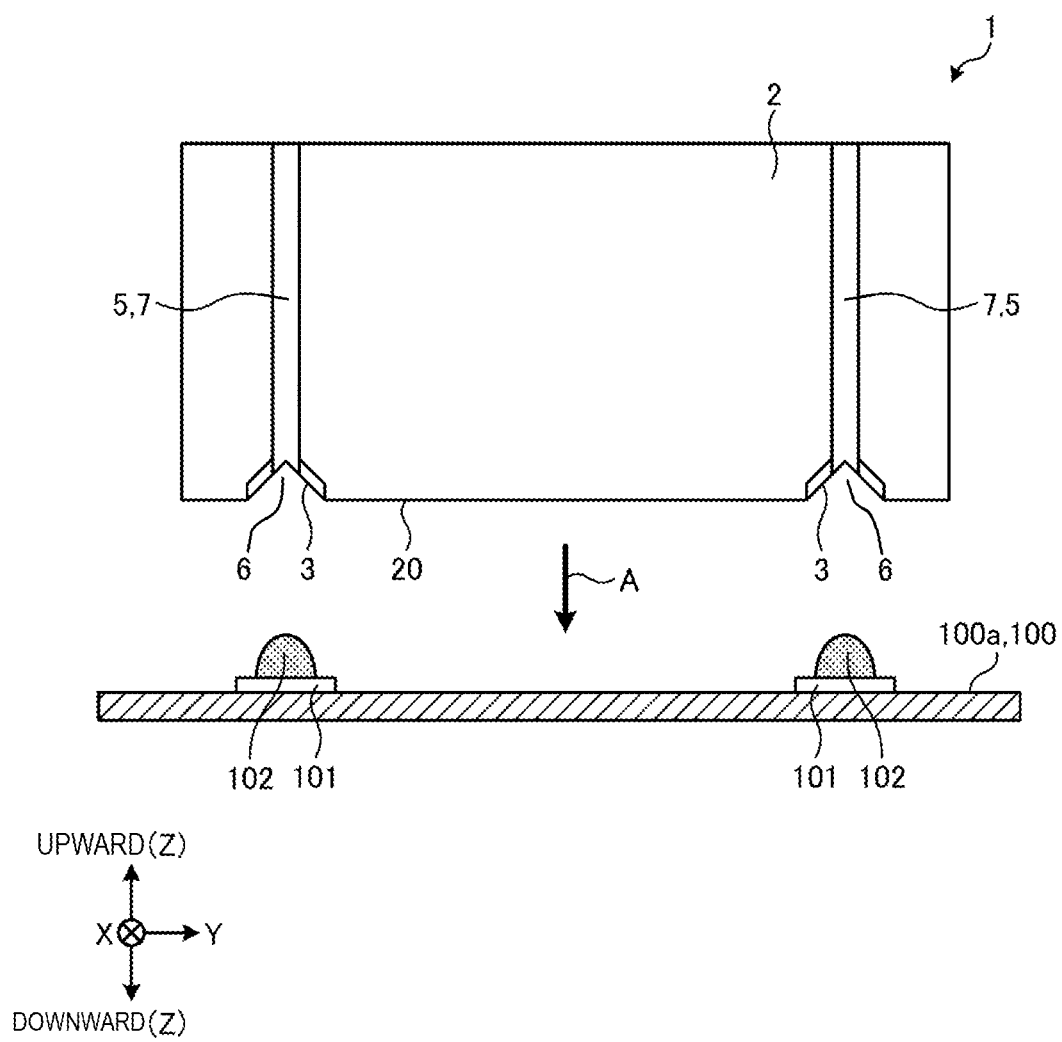
FIG. 3 is a side view illustrating a state where the electronic component according to the first embodiment is placed above a substrate.
Figure 4:
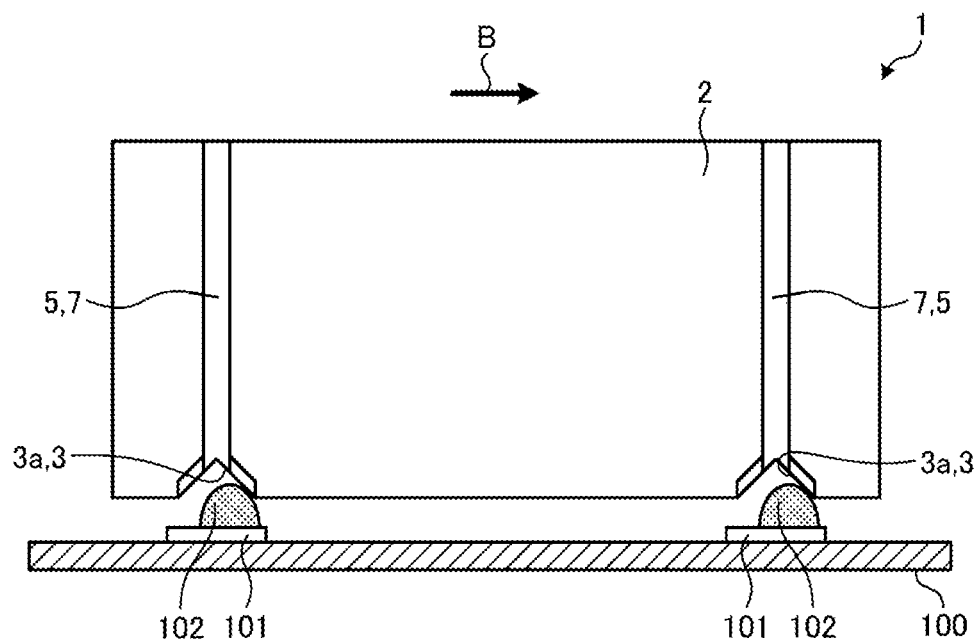
FIG. 4 is a side view illustrating a state where the electronic component according to the first embodiment is mounted on the substrate (illustrating an electronic component module)
Figure 4:
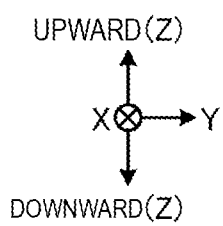
Figure 5:
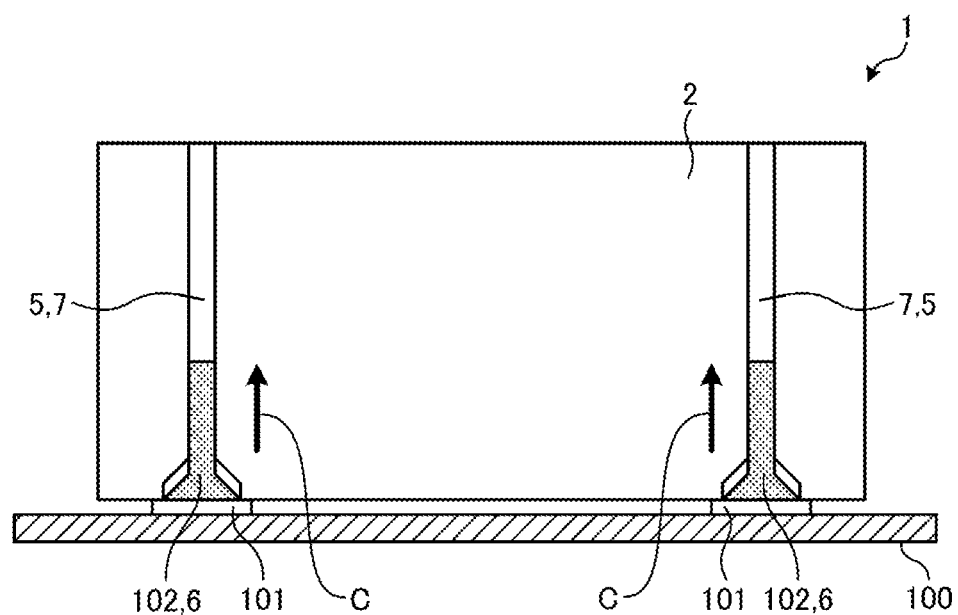
FIG. 5 is a side view illustrating a state where the substrate on which the electronic component according to the first embodiment has been mounted (the electronic component module) is heated.
Figure 5:
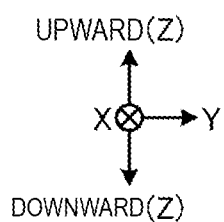

FIG. 1 is a perspective view of an electronic component according to the first embodiment. FIG. 2 is a bottom view of the electronic component according to the first embodiment when viewed from a first main surface. FIG. 3 is a side view illustrating a state where the electronic component according to the first embodiment is placed above a substrate. FIG. 4 is a side view illustrating a state where the electronic component according to the first embodiment is mounted on the substrate. FIG. 5 is a side view illustrating a state where the substrate on which the electronic component according to the first embodiment has been mounted (an electronic component module) is heated.

As illustrated in FIG. 1, an electronic component 1 according to the first embodiment includes a main body portion 2 and two connection terminals 3 that are provided on a first main surface 20 of the main body portion 2. Examples of the electronic component 1 include a capacitor and an inductor. The two connection terminals 3 are components having the same shape.

The main body portion 2 has a substantially rectangular parallelepiped shape. Accordingly, the main body portion 2 has the first main surface 20 that faces a substrate 100 (see FIG. 3), four side surfaces that are adjacent to the first main surface 20, and a second main surface 23 that is oriented in a direction opposite to the direction in which the first main surface 20 is oriented.

The first main surface 20 has four sides. Note that one of the four sides will be referred to as a first side 31, and another one of the four sides that is opposite to the first side 31 will be referred to as a second side 32. In addition, one of the four side surfaces of the main body portion 2 that shares the first side 31 with the first main surface 20 will be referred to as a first side surface 21. The side surface that shares the second side 32 with the first main surface 20 will be referred to as a second side surface 22. A direction in which the first side 31 and the second side 32 are arranged (a direction in which the connection terminals 3 extend) will hereinafter be referred to as a first direction X. A direction in which the first side 31 extends will be referred to as a second direction Y. A direction that is perpendicular to the first direction X and the second direction Y will be referred to as a third direction Z.

The first main surface 20 has two bottom-surface grooves 24 that are recessed toward the second main surface 23. The two bottom-surface grooves 24 are isolated from each other in the second direction Y. The bottom-surface grooves 24 extend in the first direction X and reach the first side 31 and the second side 32. Thus, the bottom-surface grooves 24 partially cut out the first side surface 21 and the second side surface 22. In addition, the bottom-surface grooves 24 each have a substantially triangular shape when viewed in the first direction X.

The connection terminals 3 are accommodated in the bottom-surface grooves 24 and extend in the first direction X. Each of the connection terminals 3 is formed in such a manner that, when viewed in the first direction X, the distance from a center portion of the connection terminal 3 to the second main surface 23 is shorter than the distance from each of the two ends of the connection terminal 3 in the second direction Y to the second main surface 23. In other words, each of the connection terminals 3 has a tapered shape that is tapered in a direction away from the first main surface 20.

In addition, each of the connection terminals 3 has a portion extending linearly from one of the two ends of the connection terminal 3 in the second direction Y to the center portion of the connection terminal 3 and a portion extending linearly from the other of the two ends to the center portion. Thus, when viewed in the first direction X, each of the connection terminals 3 is substantially V-shaped so as to correspond to one of the bottom-surface grooves 24.

Accordingly, each of the connection terminals 3 of the present embodiment includes a bottom portion 4 that projects toward the second main surface 23 at the center portion of the connection terminal 3. A surface of each of the connection terminals 3 that faces one of electrode pads 101 (see FIG. 3) includes a pair of inclined surfaces 3a and 3a. Each of the connection terminals 3 further has a recess 6 between the pair of inclined surfaces 3a and 3a, the recess 6 being recessed in a direction from the first main surface 20 toward the second main surface 23 so as to have a substantially triangular shape.

The first side surface 21 has a third side 33 that is opposite to the first side 31. The third side 33 is shared by the first side surface 21 and the second main surface 23. The first side surface 21 has two first side-surface grooves 7 that are recessed toward the second side surface 22. When viewed in the third direction Z, each of the first side-surface grooves 7 has a substantially semicircular shape having a diameter of about 0.05 mm.

The first side-surface grooves 7 extend linearly in the third direction Z. One of the two end portions of each of the first side-surface grooves 7, the one end portion extending toward the first side 31, reaches the first side 31. Thus, each of the first side-surface grooves 7 cuts out one of the bottom-surface grooves 24 of the first main surface 20 (see FIG. 2). Consequently, each of the first side-surface grooves 7 and a corresponding one of the recesses 6 communicate with each other. In addition, each of the first side-surface grooves 7 partially cuts out the bottom portion 4 of the corresponding bottom-surface groove 24. The other of the two end portions of each of the first side-surface grooves 7, the other end portion extending toward the third side 33, reaches the third side 33 and partially cuts out the second main surface 23.

The second side surface 22 has a fourth side 34 that is opposite to the second side 32. The fourth side 34 is shared by the second side surface 22 and the second main surface 23. The second side surface 22 has two second side-surface grooves 8 that are recessed toward the first side surface 21. When viewed in the third direction Z, each of the second side-surface grooves 8 has a substantially semicircular shape having a diameter of about 0.05 mm.

The second side-surface grooves 8 extend linearly in the third direction Z. One of the two end portions of each of the second side-surface grooves 8, the one end portion extending toward the second side 32, reaches the second side 32. Thus, each of the second side-surface grooves 8 cuts out one of the bottom-surface grooves 24 of the first main surface 20 (see FIG. 2). Consequently, each of the second side-surface grooves 8 and a corresponding one of the recesses 6 communicate with each other. In addition, each of the second side-surface grooves 8 partially cuts out the corresponding bottom portion 4. The other of the two end portions of each of the second side-surface grooves 8, the other end portion extending toward the fourth side 34, reaches the fourth side 34 and partially cuts out the second main surface 23.

Side-surface terminals 5 each of which has electrical conductivity are provided on the inner sides (the inner peripheral surfaces) of the first side-surface grooves 7. Each of the side-surface terminals 5 is an electric conductor layer that is formed by a plating treatment and extends in the third direction Z along the corresponding first side-surface groove 7. In addition, each of the side-surface terminals 5 is provided over the entire inner surface of the corresponding first side-surface groove 7. Thus, one of the two end portions of each of the side-surface terminals 5, the one end portion extending toward the first side 31, is connected to one of the connection terminals 3. Similarly, the side-surface terminals 5 each of which has electrical conductivity are provided on the inner sides (the inner peripheral surfaces) of the second side-surface grooves 8. The side-surface terminals 5 of the second side-surface grooves 8 are provided over the entire inner surfaces of the second side-surface grooves 8. The side-surface terminals 5 of the second side-surface grooves 8 each have an end portion that extends toward the first side 31 and that is connected to one of the connection terminals 3.

Joining (soldering) of the electronic component 1 of the first embodiment will now be described with reference to FIG. 3, FIG. 4, and FIG. 5. Note that, regarding the third direction Z in the following description, the direction in which the first main surface 20 is oriented will be referred to as a downward direction, and the direction in which the second main surface 23 is oriented will be referred to as an upward direction.

As illustrated in FIG. 3, the electronic component 1 is placed above the substrate 100 first. In addition, the position of the electronic component 1 is adjusted in such a manner that each of the connection terminals 3 overlaps one of the electrode pads 101 in the third direction Z. Note that the substrate 100 is a substantially plate-shaped component having an insulating property and has a main surface 100*a* onto which the electronic component 1 is mounted, and wiring lines are arranged inside the substrate 100. The two electrode pads 101 each of which extends in the first direction X are arranged on the main surface 100*a* of the substrate 100. Joining members 102 are joined to the top surfaces of the electrode pads 101. Each of the joining members 102 is made of a solder alloy or an electrically conductive paste. In addition, the length of each of the electrode pads 101 in the first direction X and the length of each of the joining members 102 in the first direction X are each the same as the length of each of the connection terminals 3. The top surface of each of the joining members 102 has a substantially semicircular shape. In order to bring the joining members 102 and the connection terminals 3 into contact with each other with certainty, the volume of each of the joining members 102 is slightly larger than the capacity of each of the recesses 6.

Next, the electronic component 1 is moved downward (see arrow A illustrated in FIG. 3), and the electronic component 1 is mounted onto the substrate 100. Here, in the case where the electronic component 1 is displaced in the second direction Y, as illustrated in FIG. 4, only one of the pair of inclined surfaces 3*a* and 3*a* of each of the connection terminals 3 is brought into contact with the top surface of the corresponding joining member 102. When the electronic component 1 is further moved downward, the electronic component 1 moves in the second direction Y by being guided by the one inclined surface 3*a* of each of the connection terminals 3 (see arrow B illustrated in FIG. 4). As a result, each of the joining members 102 is brought into contact with both the inclined surfaces 3*a* and 3*a* of the corresponding connection terminal 3, and the position of the electronic component 1 is corrected.

Next, the substrate 100 on which the electronic component 1 has been mounted is heated. As a result, the joining members 102 melt (reflow), and the recesses 6 are filled with the joining members 102. Then, portions of the joining members 102 with which the recesses 6 are filled, the portions being located on the two sides of the connection terminals 3 in the first direction X, move along the side-surface terminals 5 toward the first side-surface grooves 7 and the second side-surface grooves 8 due to the capillary action thereof (see arrows C illustrated in FIG. 5). In this manner, the joining members 102 partially enter the first side-surface grooves 7 and the second side-surface grooves 8. As a result, the first main surface 20 of the electronic component 1 is brought into contact with the electrode pads 101. Subsequently, the substrate 100 on which the electronic component 1 has been mounted is cooled, and the joining members 102 are solidified. As a result, the connection terminals 3 and the electrode pads 101 are joined to each other, and the soldering is completed.

As described above, the electronic component 1 of the first embodiment includes the main body portion 2 that has the first main surface 20 having the first side 31 and the second side 32, which is opposite to the first side 31, the second main surface 23, which is oriented in the direction opposite to the direction in which the first main surface 20 is oriented, the first side surface 21, which shares the first side 31 with the first main surface 20, and the second side surface 22, which shares the second side 32 with the first main surface 20, and has the side-surface grooves (the first side-surface grooves 7 and the second side-surface grooves 8) that are formed in the first side surface 21 and the second side surface 22 and that extend from the first main surface 20 to the second main surface 23. In addition, the electronic component 1 of the first embodiment includes the connection terminals 3 that have electrical conductivity and that are formed on the first main surface 20 in such a manner as to be isolated from each other and the side-surface terminals 5 that have electrical conductivity and that are provided on the inner sides of the side-surface grooves (the first side-surface grooves 7 and the second side-surface grooves 8) of the main body portion 2 such that each of the side-surface terminals 5 is electrically connected to at least one of the two end portions of the corresponding connection terminal 3.

According to the above-described configuration, portions of the melted joining members 102 move into the side-surface grooves (the first side-surface grooves 7 and the second side-surface grooves 8). Thus, the joining members 102 interposed between the connection terminals 3 and the electrode pads 101 are reduced in amount, and the height of the electronic component 1 is reduced.

The side-surface grooves of the electronic component 1 of the first embodiment include the first side-surface grooves 7 formed in the first side surface 21 and the second side-surface grooves 8 formed in the second side surface 22, and the connection terminals 3 each extend from the first side 31 of the first main surface 20 to the second side 32 of the first main surface 20 and each have the one end portion electrically connected to the side-surface terminal 5 of one of the first side-surface grooves 7 and the other end portion electrically connected to the side-surface terminal 5 of one of the second side-surface grooves 8.

If only the first side surface 21 has the side-surface grooves, only portions of the joining members 102 near the first side surface 21 are reduced in amount, and the electronic component 1 is inclined. In contrast, according to the first embodiment, each of the joining members 102 is reduced in amount on both sides in the first direction X. Therefore, inclination of the electronic component 1 is suppressed.

The first main surface 20 of the electronic component 1 of the first embodiment has the plurality of bottom-surface grooves 24 each extending from the first side 31 to the second side 32, and the connection terminals 3 are accommodated in their respective bottom-surface grooves 24.

According to the above configuration, the connection terminals 3 do not project toward the substrate 100 from the first main surface 20. Consequently, the height of the electronic component 1 is reduced.

The bottom-surface grooves 24 of the electronic component 1 of the first embodiment each have a width decreasing in the direction from the first main surface 20 toward the second main surface 23.

According to the above configuration, the electronic component 1 has the pairs of inclined surfaces 3a and 3a. Thus, when the electronic component 1 is mounted onto the substrate 100, misalignment of the electronic component 1 is corrected, and a contact failure is avoided. In addition, the connection terminals 3, each of which has a tapered shape, have the recesses 6 where the joining members 102 enter. Thus, the joining members 102 do not project toward the substrate 100 from the first main surface 20, and the height of the electronic component 1 is reduced.

In the electronic component 1 of the first embodiment, the side-surface grooves (the first side-surface grooves 7 and the second side-surface grooves 8) and the connection terminals 3 are connected to one another at the bottom portions 4 of the bottom-surface grooves 24, each of the bottom portions 4 having a width less than those of the other portions of the bottom surface groove 24.

According to the above-described configuration, when the recesses 6 are filled with the joining members 102, that is, when the entire inclined surfaces 3a and 3a of the connection terminals 3 are brought into contact with the joining members 102, the joining members 102 can move into the side-surface grooves (the first side-surface grooves 7 and the second side-surface grooves 8) via the side-surface terminals 5. Thus, a sufficient contact area between the connection terminals 3 and the joining members 102 is ensured, and the connection terminals 3 and the electrode pads 101 are joined to each other with certainty.

Although the first embodiment has been described above, in the electronic component of the present disclosure, the width of each of the side-surface grooves in the second direction Y is not limited to the numerical value mentioned as an example in the description of the first embodiment as long as the melted joining members 102 can be drawn into the side-surface grooves through the recesses 6 due to the capillary action thereof. In addition, the cross-sectional shape of each of the side-surface grooves is not limited to a substantially semicircular shape.

Furthermore, the shape of each of the connection terminals 3 when viewed in the first direction X is not limited to that mentioned as an example in the description of the first embodiment. Other embodiments in which the shapes of the connection terminals 3 and the shapes of the side-surface grooves are changed will be described below. Note that, in the following description, components that are the same as those of the above-described first embodiment will be denoted by the same reference signs, and repeated descriptions will be omitted.

Second Embodiment

Figure 6:
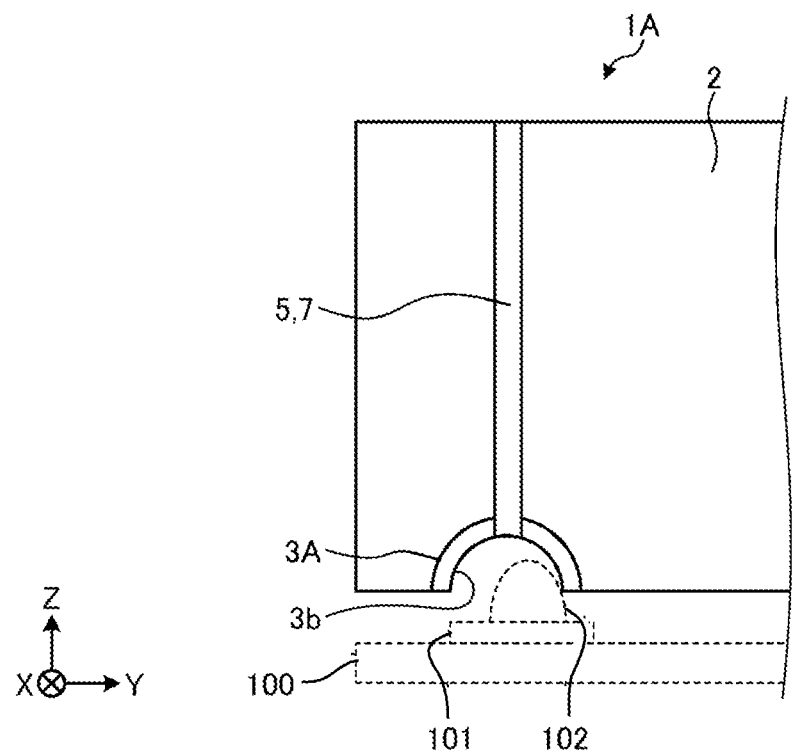
FIG. 6 is a side view illustrating, in an enlarged manner, a connection terminal that is included in an electronic component according to a second embodiment and the peripheral portion.

FIG. 6 is a side view illustrating, in an enlarged manner, a connection terminal that is included in an electronic component according to a second embodiment and the peripheral portion. As illustrated in FIG. 6, an electronic component 1A of the second embodiment is different from the electronic component 1 of the first embodiment in that the electronic component 1A includes connection terminals 3A instead of the connection terminals 3. The connection terminals 3A each have a substantially semicircular shape when viewed in the first direction X. The connection terminals 3A each have a substantially arc-shaped inner peripheral surface 3b that faces the substrate 100 and that has a substantially arc shape. In other words, each of the connection terminals 3A has a tapered shape that is tapered in a direction away from the substrate 100. According to the connection terminals 3A, in the case where the connection terminals 3A are displaced in the second direction Y, the connection terminals 3A are guided by the substantially arc-shaped inner peripheral surfaces 3b with which the joining members 102 are brought into contact, so that misalignment of the electronic component 1A is corrected.

Third Embodiment

Figure 7:
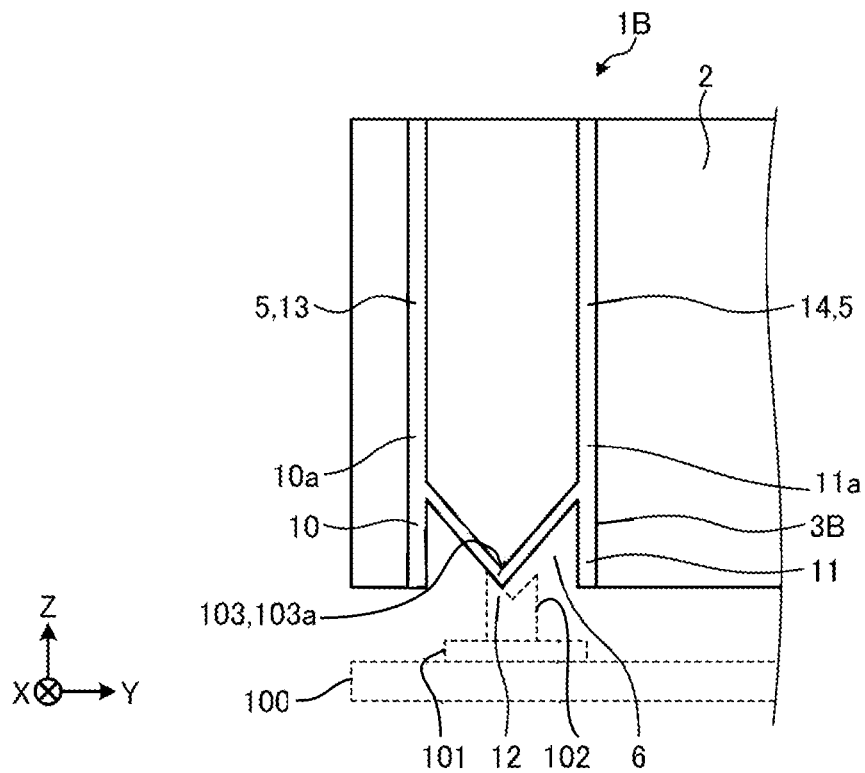
FIG. 7 is a side view illustrating, in an enlarged manner, a connection terminal that is included in an electronic component according to a third embodiment and the peripheral portion.

FIG. 7 is a side view illustrating, in an enlarged manner, a connection terminal that is included in an electronic component according to a third embodiment and the peripheral portion. As illustrated in FIG. 7, an electronic component 1B of the third embodiment is different from the electronic component 1 of the first embodiment in that the electronic component 1B includes connection terminals 3B instead of the connection terminals 3. In addition, the electronic component 1B of the third embodiment is different from the electronic component 1 of the first embodiment in that the number of side-surface grooves is changed in response to the change to the connection terminals 3B. The differences will be described below.

When viewed in the first direction X, each of the connection terminals 3B has a shape formed by connecting a first substantially triangular portion 10 having a substantially triangular shape and a second substantially triangular portion 11 having a substantially triangular shape to each other in the second direction Y. In other words, each of the connection terminals 3B is substantially M-shaped when viewed in the first direction X. In each of the connection terminals 3B, the portion in which the first triangular portion 10 and the second triangular portion 11 are connected to each other forms a projecting portion 12 that projects toward the substrate 100. Note that the top surfaces of the joining members 102 each have a recess 103 that has a substantially triangular shape and that is recessed toward the substrate 100 so as to correspond to the above-described connection terminals 3B. In the case where the connection terminals 3B are displaced in the second direction Y, the connection terminals 3B are guided by inclined surfaces 103a of the recesses 103 with which the projecting portions 12 are brought into contact, so that misalignment of the electronic component 1B is corrected.

The first triangular portion 10 of each of the connection terminals 3B has a tapered shape and includes a bottom portion 10a. The second triangular portion 11 of each of the connection terminals 3B has a tapered shape and includes a bottom portion 11a. In the third embodiment, third side-surface grooves 13 that cut out the bottom portions 10a of the first triangular portions 10 and fourth side-surface grooves 14 that cut out the bottom portions 11a of the second triangular portions 11 are formed in the first side surface 21 and the second side surface (not illustrated in FIG. 7) of the electronic component 1B. With the above configuration, when the recesses 6 are filled with the melted joining members 102, the joining members 102 move into both the third side-surface grooves 13 and the fourth side-surface grooves 14, and the height of the electronic component 1B is reduced.

Fourth Embodiment

Figure 8:
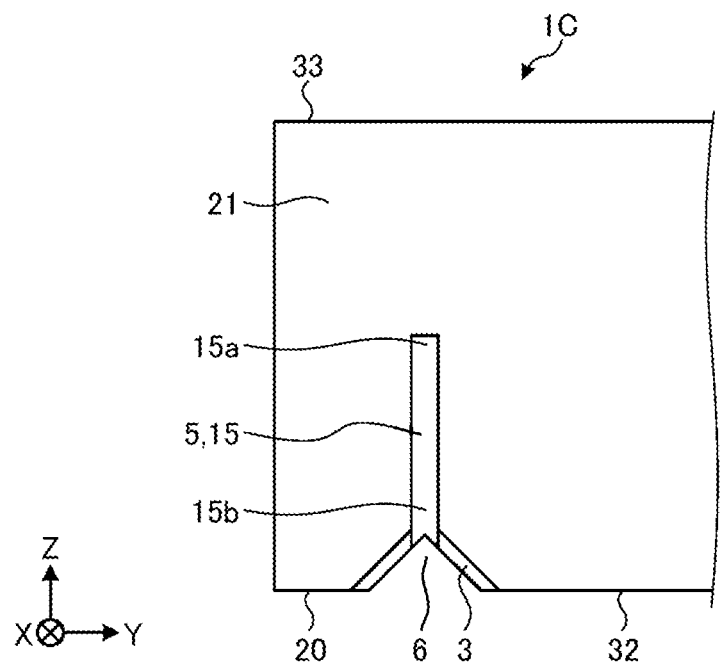
FIG. 8 is a side view illustrating, in an enlarged manner, a connection terminal that is included in an electronic component according to a fourth embodiment and the peripheral portion.

FIG. 8 is a side view illustrating, in an enlarged manner, a connection terminal that is included in an electronic component according to a fourth embodiment and the peripheral portion. As illustrated in FIG. 8, an electronic component 1C of the fourth embodiment is different from the electronic component 1 of the first embodiment in that the electronic component 1C has side-surface grooves 15 instead of the side-surface grooves (the first side-surface grooves 7 and the second side-surface grooves 8). The side-surface grooves 15 of the third embodiment have end portions 15a on the side on which the third side 33 is present, and these end portions 15a do not reach the third side 33. In addition, the side-surface grooves 15 have end portions 15b on the side on which the second side 32 is present, and these end portions 15b communicate with the recesses 6. Even with such side-surface grooves 15, the joining members 102, with which the recesses 6 are filled, move into the side-surface grooves 15, and thus, a reduction in the height of the electronic component 1C is achieved.

Fifth Embodiment

Figure 9:
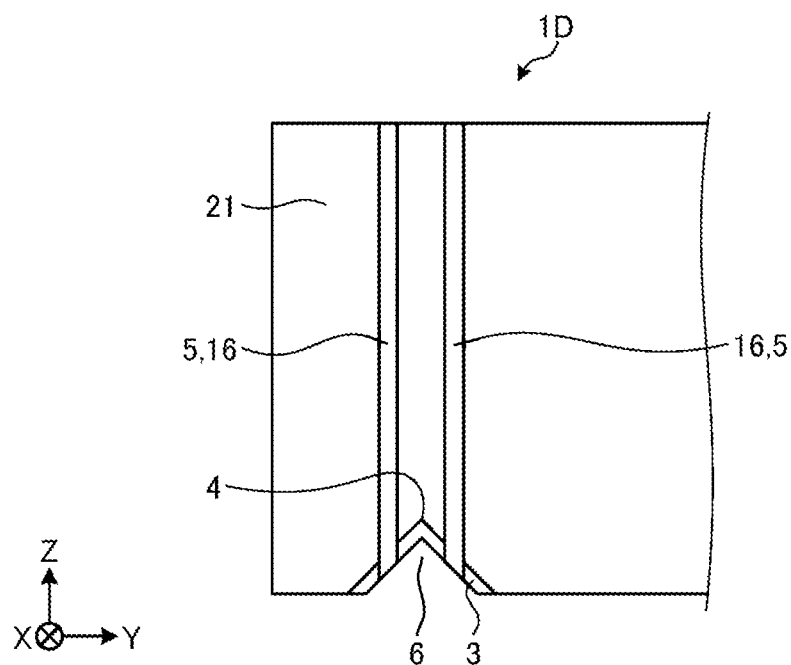
FIG. 9 is a side view illustrating, in an enlarged manner, a connection terminal that is included in an electronic component according to a fifth embodiment and the peripheral portion.

FIG. 9 is a side view illustrating, in an enlarged manner, a connection terminal that is included in an electronic component according to a fifth embodiment and the peripheral portion. As illustrated in FIG. 9, an electronic component 1D of the fifth embodiment is different from the electronic component 1 of the first embodiment in that the number of the side-surface grooves and the positions of the side-surface grooves are changed. In the fifth embodiment, side-surface grooves 16 are formed in such a manner that each pair of the side-surface grooves 16 are formed at positions that are offset in the second direction Y with respect to the bottom portion 4 of one of the connection terminals 3. Thus, each pair of the side-surface grooves 16 cut out portions that are offset in the second direction Y with respect to the corresponding bottom portion 4. According to the electronic component 1D, before the recesses 6 are filled with the joining members 102, that is, before the joining members 102 reach the bottom portions 4, the joining members 102 move into the side-surface grooves 16. As a result, a larger amount of the joining members 102 move into the side-surface grooves 16, and a reduction in the height of the electronic component 1D is achieved. Note that the side-surface grooves 16 of the present embodiment can be applied even to the case of using the connection terminals having different shapes.

Each of the side-surface grooves of the present disclosure is not particularly limited to a linear groove and may be a curved groove or a wavy groove. In the above-described embodiments, although the side-surface grooves are formed in both the first side surface 21 and the second side surface 22, the side-surface grooves may be formed in only one of the first side surface 21 and the second side surface 22.

Sixth Embodiment

Figure 10:
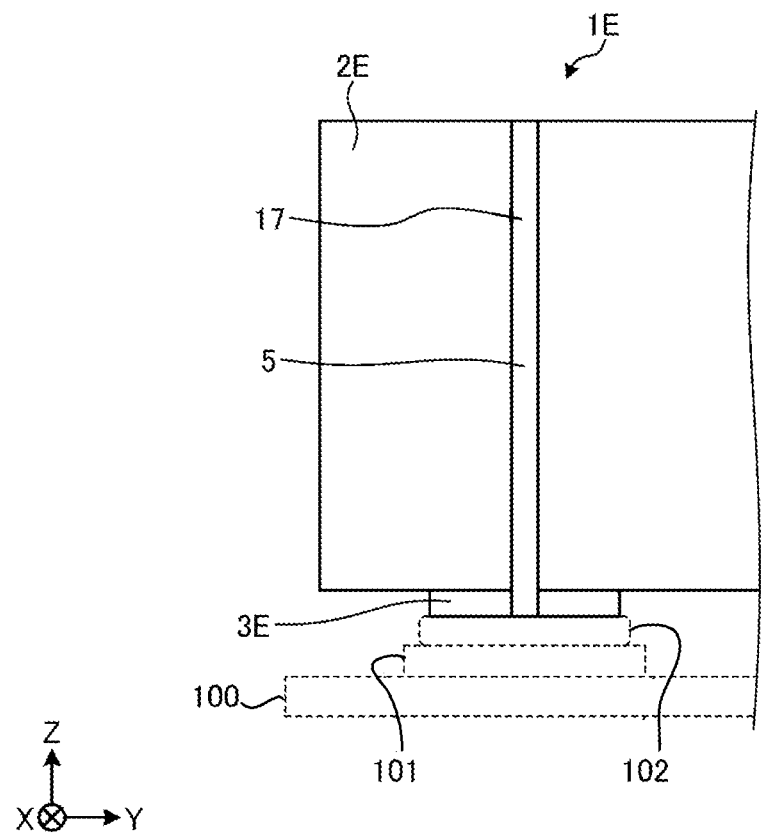
FIG. 10 is a side view illustrating, in an enlarged manner, a connection terminal that is included in an electronic component according to a sixth embodiment and the peripheral portion.

FIG. 10 is a side view illustrating, in an enlarged manner, a connection terminal that is included in an electronic component according to a sixth embodiment and the peripheral portion. As illustrated in FIG. 10, an electronic component 1E of the sixth embodiment is different from the electronic component 1 of the first embodiment in that the electronic component 1E does not have the bottom-surface grooves 24. In addition, the electronic component 1E of the sixth embodiment is different from the electronic component 1 of the first embodiment in that the electronic component 1E includes connection terminals 3E instead of the connection terminals 3. A main body portion 2E of the sixth embodiment has the first main surface 20 that is a flat surface and does not have the bottom-surface grooves 24 (see FIG. 1). Each of the connection terminals 3E has a substantially flat plate-like shape. Center portions of the connection terminals 3E in the second direction Y are cut out by side-surface grooves 17, and the connection terminals 3E are connected to the side-surface terminals 5. According to the sixth embodiment, the joining members 102 that are interposed between the connection terminals 3E and the electrode pads 101 move into the side-surface grooves 17 via the side-surface terminals 5. Thus, the thickness of each of the joining members 102 can be reduced, and a reduction in the height of the electronic component 1E can be achieved.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An electronic component comprising:
   a main body portion having a first main surface having a first side and a second side opposite to the first side, a second main surface opposite to the first main surface, a first side surface sharing the first side with the first main surface, and a second side surface sharing the second side with the first main surface;
   a plurality of connection terminals having electrical conductivity and arranged on the first main surface in such a manner as to be isolated from each other; and
   side-surface terminals having electrical conductivity,
   wherein the main body portion has side-surface grooves provided in the first side surface and the second side surface and extending from the first main surface toward the second main surface, and
   wherein the side-surface terminals are provided on inner sides of the side-surface grooves of the main body portion and are each electrically connected to at least one of two end portions of each of the connection terminals.

2. The electronic component according to claim 1,
   wherein the side-surface grooves include first side-surface grooves provided in the first side surface and second side-surface grooves provided in the second side surface, and
   wherein each of the connection terminals extends from the first side of the first main surface to the second side of the first main surface,
   wherein one of the end portions of each of the connection terminals is electrically connected to each of the side-surface terminals of the first side-surface grooves, and
   wherein another one of the end portions of each of the connection terminals is electrically connected to each of the side-surface terminals of the second side-surface grooves.

3. The electronic component according to claim 1,
   wherein the first main surface has a plurality of bottom-surface grooves each extending from the first side to the second side, and
   wherein each of the connection terminals is accommodated in each of the bottom-surface grooves.

4. The electronic component according to claim 3,
   wherein each of the bottom-surface grooves has a width decreasing in a direction from the first main surface toward the second main surface.

5. The electronic component according to claim 4,
wherein the side-surface terminals and the connection terminals are connected to each other at bottom portions of the bottom-surface grooves, the bottom portions each having the least width.

6. The electronic component according to claim 2,
wherein the first main surface has a plurality of bottom-surface grooves each extending from the first side to the second side, and
wherein each of the connection terminals is accommodated in each of the bottom-surface grooves.

7. An electronic component module comprising:
the electronic component according to claim 1;
a substrate provided with electrode pads and having the electronic component mounted; and
joining members interposed between the connection terminals of the electronic component and the electrode pads of the substrate,
wherein portions of the joining members are present in the side-surface grooves of the electronic component.

8. An electronic component module comprising:
the electronic component according to claim 2;
a substrate provided with electrode pads and having the electronic component mounted; and
joining members interposed between the connection terminals of the electronic component and the electrode pads of the substrate,
wherein portions of the joining members are present in the side-surface grooves of the electronic component.

9. An electronic component module comprising:
the electronic component according to claim 3;
a substrate provided with electrode pads and having the electronic component mounted; and
joining members interposed between the connection terminals of the electronic component and the electrode pads of the substrate,
wherein portions of the joining members are present in the side-surface grooves of the electronic component.

10. An electronic component module comprising:
the electronic component according to claim 4;
a substrate provided with electrode pads and having the electronic component mounted; and
joining members interposed between the connection terminals of the electronic component and the electrode pads of the substrate,
wherein portions of the joining members are present in the side-surface grooves of the electronic component.

11. An electronic component module comprising:
the electronic component according to claim 5;
a substrate provided with electrode pads and having the electronic component mounted; and
joining members interposed between the connection terminals of the electronic component and the electrode pads of the substrate,
wherein portions of the joining members are present in the side-surface grooves of the electronic component.

* * * * *